(12) United States Patent
Gilliland et al.

(10) Patent No.: US 6,906,910 B1
(45) Date of Patent: Jun. 14, 2005

(54) STRUCTURES FOR IMPLEMENTING INTEGRATED CONDUCTOR AND CAPACITOR IN SMD PACKAGING

(75) Inventors: Don Alan Gilliland, Rochester, MN (US); Dennis James Wurth, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 10/760,448

(22) Filed: Jan. 20, 2004

(51) Int. Cl.[7] .................. H01G 4/005; H01G 4/228; H01G 4/06

(52) U.S. Cl. ............... 361/328; 361/303; 361/306.1; 361/311

(58) Field of Search ............... 361/301.2, 301.3, 361/301.4, 303, 306.1, 306.2, 306.3, 308.1, 308.2, 309, 311–313

(56) References Cited

U.S. PATENT DOCUMENTS

| | | | |
|---|---|---|---|
| 5,590,016 A | * 12/1996 | Fujishiro et al. | ............ 361/313 |
| 6,475,607 B2 | * 11/2002 | Ueda et al. | ................. 428/210 |
| 2003/0151471 A1 | * 8/2003 | Yamada et al. | ............. 333/193 |

* cited by examiner

Primary Examiner—Eric Thomas
(74) Attorney, Agent, or Firm—Joan Pennington

(57) ABSTRACT

Structures are provided for implementing an integrated conductor and capacitor in a surface mounted device (SMD) package. A first pair and a second pair of contacts contained within the SMD package respectively are provided in mating engagement with a first pair and a second pair of corresponding SMD package contacts. A conductor extends between the first pair of contacts, contained within the SMD package. A capacitor is defined between the second pair of contacts, contained within the SMD package. An additional one or pair of integral capacitors optionally is provided for providing additional capacitance to ground to decouple common mode noise from the power planes.

18 Claims, 6 Drawing Sheets

STRUCTURES FOR IMPLEMENTING INTEGRATED CONDUCTOR AND CAPACITOR IN SMD PACKAGING

FIELD OF THE INVENTION

The present invention relates generally to the electronic design automation field, and more particularly, relates to a structure for implementing an integrated conductor and capacitor in surface mounted device (SMD) packaging.

DESCRIPTION OF THE RELATED ART

A serious electromagnetic emission occurs when a signal or conductor line switches references on a board by crossing split planes. This often occurs in a complex layout when a conductor crosses certain voltage domains, for example, 5V to 3.5V. The best solution is to avoid crossing a, split and creating the radiating source. But, due to cost constraints, the number of layers, or wireability the choice may be made to cross the split.

A solution that is commonly implemented is to place a capacitor near the split thus providing a low frequency return path for the signal. Another less popular solution is to place a decoupling capacitor from the referenced plane and ground on both sides of the split, for example, from 3.3V to Ground, and from 5V and Ground. The problem with these solutions is that the return current does not take a well-behaved return path back to the source causing radiation and reflections.

A need exists for a mechanism to provide a well-behaved return current path in surface mounted device (SMD) packaging having a signal or conductor that switches references on a board by crossing split planes.

SUMMARY OF THE INVENTION

Important aspects of the present invention are to provide a structure for implementing an integrated conductor and capacitor in surface mounted device (SMD) packaging. Other important aspects of the present invention are to provide such structure for implementing an integrated conductor and capacitor in surface mounted device (SMD) packaging substantially without negative effect and that overcome some of the disadvantages of prior art arrangements.

In brief, structures are provided for implementing an integrated conductor and capacitor in a surface mounted device (SMD) package. A first pair and a second pair of contacts contained within the SMD package respectively are provided in mating engagement with a first pair and a second pair of corresponding SMD package contacts. A conductor extends between the first pair of contacts, contained within the SMD package. A capacitor is defined between the second pair of contacts, contained within the SMD package.

In accordance with features of the invention, an additional one or pair of integral capacitors optionally is provided for providing additional capacitance to ground to decouple common mode noise from the power planes.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
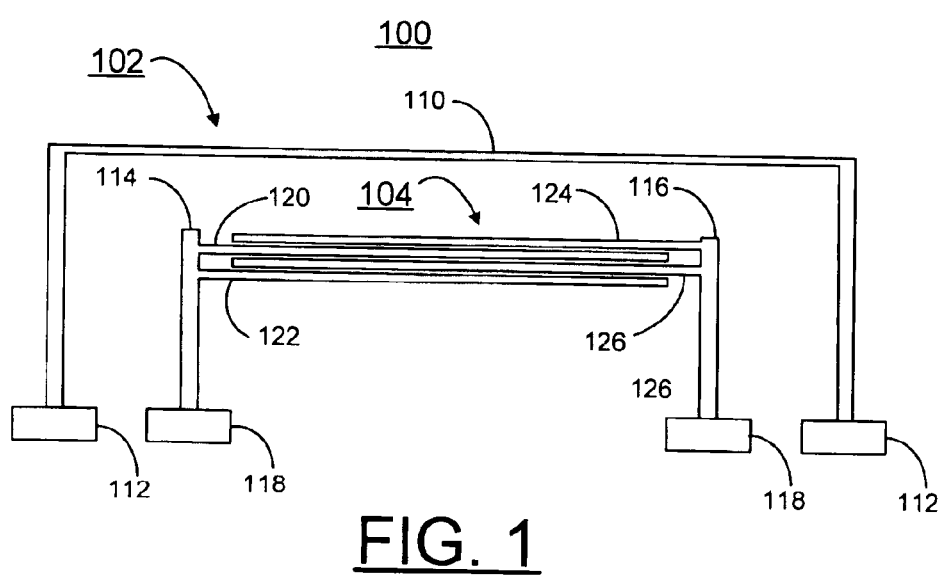
FIG. 1 is diagram illustrating a side view of an exemplary integrated conductor and capacitor structure for use in surface mounted device (SMD) packaging in accordance with the preferred embodiment.
Figure 2:
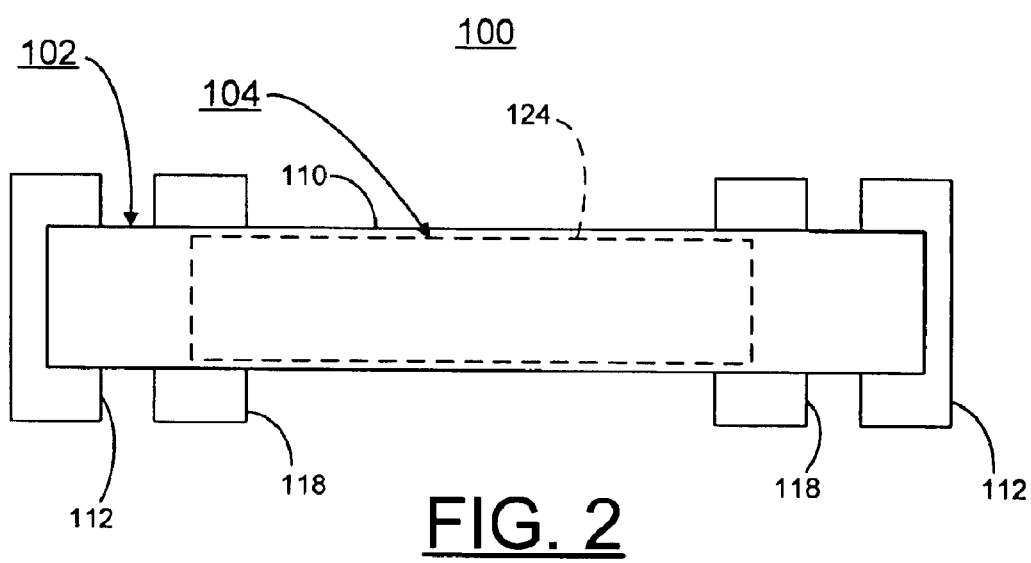
FIG. 2 is a diagram illustrating a top view of the exemplary integrated conductor and capacitor structure of FIG. 1 in accordance with the preferred embodiment.

Having reference now to the drawings, in FIGS. 1, and 2, there is shown an exemplary integrated conductor and capacitor structure generally designated by the reference character 100 for use in surface mounted device (SMD) packaging in accordance with one preferred embodiment.

The exemplary integrated conductor and capacitor structure 100 advantageously can improve or shorten the path length by integrating a cross of the split with a conductor generally designated by the reference character 102 integrated with a coupling capacitor generally designated by the reference character 104.

In accordance with features of the preferred embodiment, the exemplary integrated conductor and capacitor structure 100 allows a common wiring technique in board layout to be used (i.e., crossing splits). This can be done by minimizing the return loop area and allowing current flow to return to the source across a well-controlled path.

In accordance with features of the preferred embodiment, simulations have shown that placing the signal conductor 102 and return path through the capacitor 104 proves a better response that what is presently available on the market. The integrated surface mounted device (SMD) conductor and capacitor structure 100 forces the placement of a coupling capacitor with the cross of a split in one discrete component. Simulations have shown that once the normal signal reference is compromised then a return current is best returned by use of a capacitance between the new reference allowing the return current to return through a minimal loop area. Although not required, the internal construction of the exemplary integrated conductor and capacitor structure 100 can be set to match the characteristic impedance of the conductor within the board structure, for example, 50 ohms. Even a mismatch shows improvement over known conventional arrangements. A conventional SMD package must be altered to allow additional board contacts, for example, two or four additional board contacts to formulate the appropriate structure.

As shown in FIGS. 1 and 2, the signal conductor 102 includes an elongated, generally U-shaped member 110 extending between a pair of outer contact pads 112. The capacitor 104 includes a pair of posts 114, 116 respectively extending from a respective one of a pair of inner contact pads 118. The respective posts 114, 116 of the capacitor 104 includes a respective pair of spaced apart parallel arms or plates 120, 122; and 124, 126. The respective spaced apart parallel plates 120, 122 carried by post 114 respectively extend between and below the spaced apart parallel plates 124, 126 carried by post 116.

The integrated surface mounted device (SMD) conductor and capacitor structure 100 can be most economically implemented with a single dielectric material, such as NPO, X7R, X5R, C0G, YTV, and the like, surrounding all internal structures including the signal conductor 102 and capacitor 104. The dielectric material is a poor conductor of electricity, while an efficient supporter of electrostatic fields that can store energy and particularly useful in capacitor 104. The use of a single dielectric material is the same practice used today by manufacturers of surface mount ceramic capacitors. This use of a single dielectric material within the integrated surface mounted device (SMD) conductor and capacitor structure 100 is not only cost effective, it is acceptable for most circuit applications.

Alternatively, to provide strict impedance control, for example, for higher speed circuits, the signal conductor 102 of the integrated surface mounted device (SMD) conductor and capacitor structure 100 is surrounded with a dielectric material having similar properties to FR4, to maintain the proper signal impedance through the part. The capacitor 104 of the integrated surface mounted device (SMD) conductor and capacitor structure 100 would be surrounded by a typical dielectric material, such as NPO, X7R, X5R, C0G, YTV, and the like, to create a hybrid component 100 made up of two types of dielectric materials.

Various conventional materials can be used to form the capacitor 104 of the integrated surface mounted device (SMD) conductor and capacitor structure 100. For example, a ceramic material, such as fired ceramic powders with various metallic titanates, plus modifier and shifters, or a glass frit material can be used to form the parallel plates 120, 122; and 124, 126. Electrodes formed of Palladium and silver or nickel can be used and capacitor terminations formed of silver and glass frit, copper and glass frit, nickel or tin can be used to form the capacitor 104.

Figure 3:
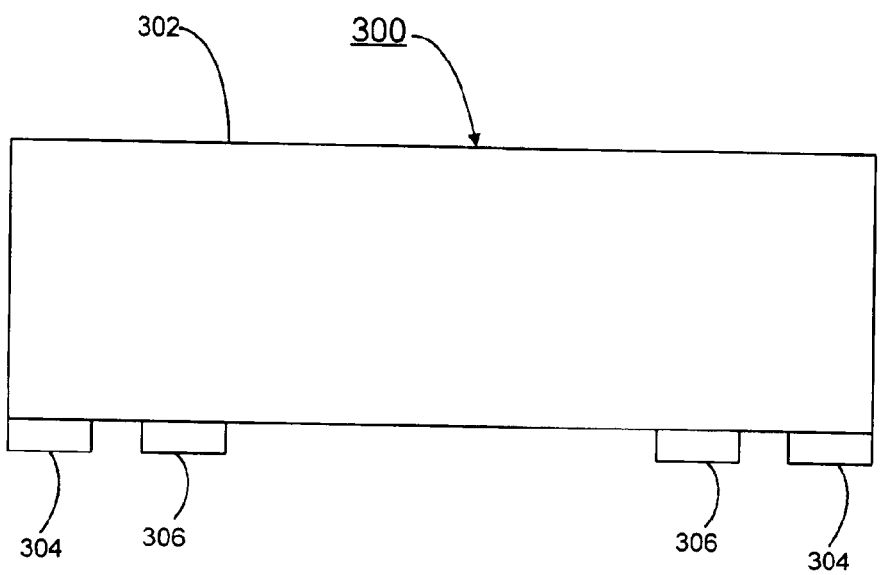
FIG. 3 is a diagram illustrating an outside of an exemplary surface mounted device (SMD) packaging receiving the exemplary integrated conductor and capacitor structure of FIG. 1 in accordance with the preferred embodiment.

Referring now to FIG. 3, there is shown an outside of an exemplary surface mounted device (SMD) packaging generally designated by the reference character 300 receiving the exemplary integrated conductor and capacitor structure 100 in accordance with the preferred embodiment. SMD package 300 includes a generally rectangular enclosure 302, a pair of outer contact pads 304, and a pair of inner contact pads 306. FIGS. 1 and 2 show the internal configuration including the four pad contacts 112, 118 for mating engagement with respective pairs of pad contacts 304, 306 of the preferred SMD package 300, as shown in FIG. 3.

Figure 4:
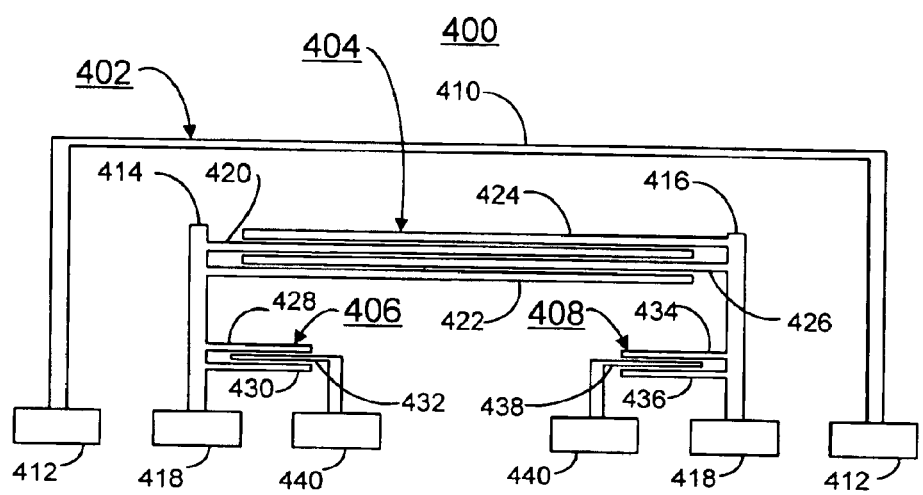
FIG. 4 is a diagram illustrating a side view of another exemplary integrated conductor and capacitor structure for use in surface mounted device (SMD) packaging in accordance with the preferred embodiment.
Figure 5:
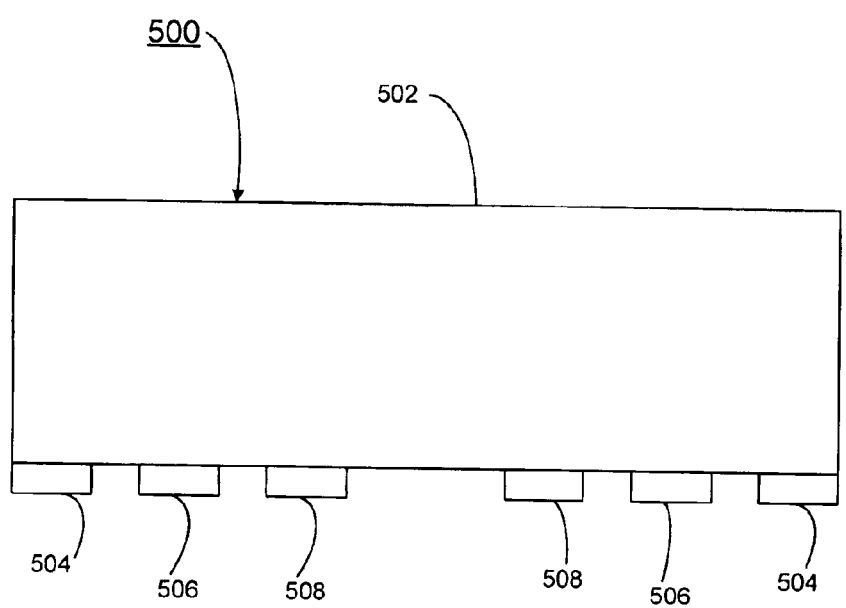
FIG. 5 is a diagram illustrating an exemplary outside surface mounted device (SMD) packaging receiving the exemplary integrated conductor and capacitor structure of FIG. 4 in accordance with the preferred embodiment.

Referring now to FIGS. 4 and 5, there is shown another exemplary integrated conductor and capacitor structure in accordance with the preferred embodiment generally designated by the reference character 400 in FIG. 4 and an exemplary outside surface mounted device (SMD) packaging generally designated by the reference character 500 or SMD package 500 receiving the exemplary integrated conductor and capacitor structure 400 is shown in FIG. 5.

As compared to the structure 100, the integrated conductor and capacitor structure 400 similarly includes a signal conductor generally designated by 402 and return path through a capacitor generally designated by 404.

The integrated conductor and capacitor structure 400 of the preferred embodiment includes an additional pair of integral capacitors generally designated by 406, 408 providing additional capacitance to ground that is further added into the first configuration structure 100, for example, to decouple common mode noise from the power planes, such as back to logic ground.

As shown in FIG. 4, the signal conductor 402 includes an elongated, generally U-shaped member 410 extending between a pair of outer contact pads 412. The capacitor 404 includes a pair of posts 414, 416 respectively extending from a respective one of a pair of inner contact pads 418. The respective posts 414, 416 of the capacitor 404 includes a respective pair of spaced apart parallel arms or plates 420, 422; and 424, 426. The respective spaced apart parallel plates 420, 422 carried by post 414 respectively extend between and below the spaced apart parallel plates 424, 426 carried by post 416.

A pair of spaced apart parallel plates 428, 430 carried by post 414 below the upper parallel plates 420, 422 is provided to form the decoupling capacitor 406. A L-shaped member 432 has a portion extending between the spaced apart parallel plates 428, 430 form the decoupling capacitor 406.

Similarly, a pair of spaced apart parallel plates 434, 436 carried by post 416 below the upper parallel plates 424, 426 is provided to form the decoupling capacitor 408. A L-shaped member 438 has a portion extending between the spaced apart parallel plates 434, 436 form the decoupling capacitor 408.

A respective one of a pair of elongated pad contacts 440 respectively supports the respective L-shaped member 432, 438 of the decoupling capacitor 406, 408. SMD package 500 includes a generally rectangular enclosure 502, a pair of outer contact pads 504, and a first and second pair of inner contact pads 506, and 508. FIG. 4 shows the internal configuration including the six pad contacts 412, 418, 440 for mating engagement with respective pairs of pad contacts 504, 506, 508 of the SMD package 500, as shown in FIG. 5.

The decoupling capacitors 406, 408 of the integrated conductor and capacitor structure 400 are formed of selected materials as described above used to form the capacitor 104. The decoupling capacitors 406, 408 of the integrated conductor and capacitor structure 400 are surrounded by a typical dielectric material, such as NPO, X7R, X5R, C0G, YTV, and the like, to create a unitary dielectric material component 400 or a hybrid component 400 made up of two types of dielectric materials with the conductor 402 surrounded by a different type of dielectric material, such as FR4.

Figure 6:
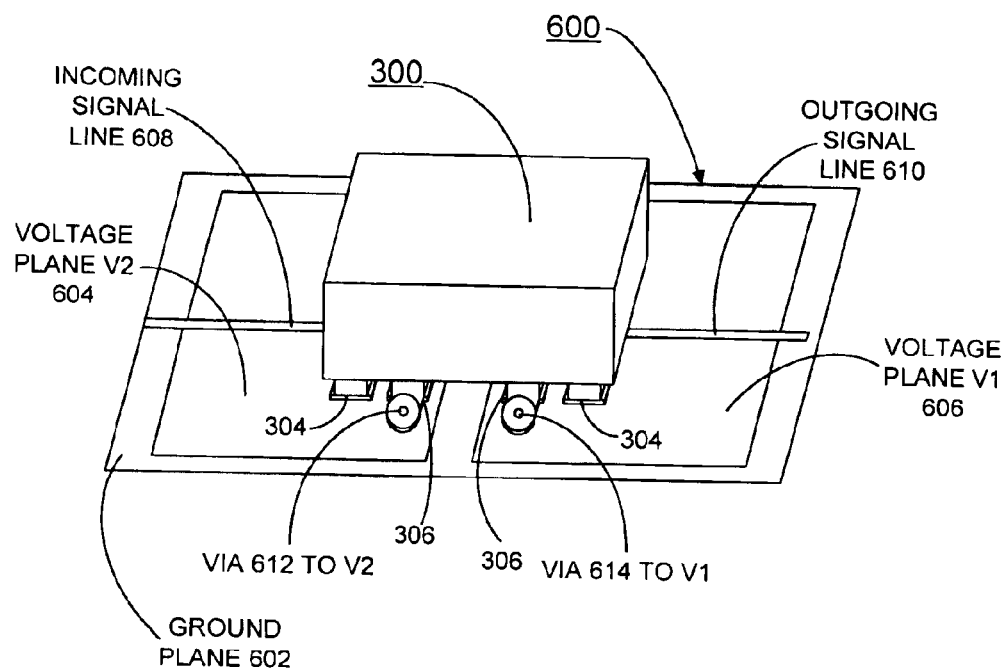
FIG. 6 is a diagram illustrating the exemplary surface mounted device (SMD) packaging of FIG. 3 receiving the exemplary integrated conductor and capacitor structure of FIG. 1 for use with an exemplary portion of a circuit board in accordance with the preferred embodiment.

FIG. 6 illustrates the exemplary SMD package 300 of FIG. 3 that receives the exemplary integrated conductor and capacitor structure 100 in use with an exemplary portion of a circuit board generally designated by the reference character 600 in accordance with the preferred embodiment. Circuit board 600 includes a ground plane 602, a voltage plane V2 604, and a voltage plane V1 606. An incoming signal line 608 and an outgoing signal line 610 are respectively connected to the pair of outer contact pads 304 of the SMD package 300 and the signal conductor 102 by the pair of outer contact pads 112 of the integrated conductor and capacitor structure 100. As shown, a respective via 612, 614 connects a respective inner contact pad 306 to the voltage plane V2 604, and the voltage plane V1 606. The voltage, plane V2 604, and the voltage plane V1 606 are connected to the capacitor 104 by the second pair of contacts pads 118 that are provided for mating engagement with to the corresponding inner contact pad 306 of the SMD package 300.

It should be understood that the present invention is not limited to the illustrated arrangement of the contact pads 112, 118 of the integrated conductor and capacitor structure 100 and corresponding mating contact pads 304, 306 of the SMD package 300. For example, various different shapes and sizes could be provided for the contact pads 112, 118 and the corresponding mating contact pads 304, 306.

While the present invention has been described with reference to the details of the embodiments of the invention shown in the drawing, these details are not intended to limit the scope of the invention as claimed in the appended claims.

What is claimed is:

1. A structure for implementing an integrated conductor and capacitor in a surface mounted device (SMD) package comprising:
    a first pair of contacts contained within the SMD package for mating engagement with a first pair of corresponding SMD package contacts;
    a second pair of contacts contained within the SMD package for mating engagement with a second pair of corresponding SMD package contacts;
    a conductor extending between said first pair of contacts and contained within the SMD package; and
    a capacitor defined between said second pair of contacts and contained within the SMD package.

2. A structure for implementing an integrated conductor and capacitor as recited in claim 1 further includes an additional one or pair of integral capacitors for providing additional capacitance to ground to decouple common mode noise from the power planes.

3. A structure for implementing an integrated conductor and capacitor as recited in claim 2 further includes an additional one or pair of third contacts contained within the SMD package for mating engagement with a corresponding SMD package third contact and wherein said additional one or pair of integral capacitors is defined between a respective one of said third contacts and one of said second pair of contacts and contained within the SMD package.

4. A structure for implementing an integrated conductor and capacitor as recited in claim 1 wherein said first pair of contacts are outer contacts and said second pair of contacts are inner contacts, located between said first pair of contacts.

5. A structure for implementing an integrated conductor and capacitor as recited in claim 4 wherein said conductor is a generally U-shaped member extending between said first pair of contacts and contained within the SMD package.

6. A structure for implementing an integrated conductor and capacitor as recited in claim 5 wherein said capacitor includes a pair of posts respectively supported by said second pair of contacts, each post including at least one outwardly extending plate; and said respective plates extending in parallel.

7. A structure for implementing an integrated conductor and capacitor as recited in claim 1 includes a dielectric material surrounding said conductor and said capacitor.

8. A structure for implementing an integrated conductor and capacitor as recited in claim 7 wherein said dielectric material includes a selected one of the group of dielectric materials including NPO, X7R, X5R, C0G, and YTV.

9. A structure for implementing an integrated conductor and capacitor as recited in claim 1 includes a first dielectric material surrounding said conductor and a second dielectric material surrounding said capacitor.

10. A structure for implementing an integrated conductor and capacitor as recited in claim 9 wherein said first dielectric material is a dielectric material having selected impedance properties for high speed operation and wherein said second dielectric material includes a selected one of the group of dielectric materials including NPO, X7R, X5R, C0G, and YTV.

11. A structure for implementing an integrated conductor and capacitor in a surface mounted device (SMD) package comprising:
    a first outer pair of contacts contained within the SMD package for mating engagement with a first pair of corresponding SMD package contacts;
    a second inner pair of contacts contained within the SMD package between said first outer pair of contacts for mating engagement with a second pair of corresponding SMD package contacts;
    at least one third contact contained within the SMD package between said second inner pair of contacts for mating engagement with a respective corresponding third SMD package contact;
    a conductor extending between said first pair of contacts and contained within the SMD package;
    a first capacitor defined between said second pair of contacts and contained within the SMD package; and
    a second capacitor defined between a respective one of said at least one third contact and one of said second pair of contacts and contained within the SMD package.

12. A structure for implementing an integrated conductor and capacitor as recited in claim 11 wherein said conductor is a generally U-shaped member extending between said first pair of contacts and contained within the SMD package.

13. A structure for implementing an integrated conductor and capacitor as recited in claim 11 wherein said first capacitor includes a pair of posts respectively supported by said second pair of contacts, each post including at least one outwardly extending plate; and said respective plates extending in parallel.

14. A structure for implementing an integrated conductor and capacitor as recited in claim 11 wherein said second capacitor includes at least one of said pair of posts respectively supported by said second pair of contacts including at least one additional spaced apart outwardly extending plate, and a generally L-shaped member supported by one said third contact having a portion extending in parallel with said at least one additional spaced apart outwardly extending plate.

15. A structure for implementing an integrated conductor and capacitor as recited in claim 11 includes a dielectric material surrounding said conductor and said first and second capacitors.

16. A structure for implementing an integrated conductor and capacitor as recited in claim 15 wherein said dielectric material includes a selected one of the group of dielectric materials including NPO, X7R, X5R, C0G, and YTV.

17. A structure for implementing an integrated conductor and capacitor as recited in claim 11 includes a first dielectric material surrounding said conductor and a second dielectric material surrounding said first and second capacitors.

18. A structure for implementing an integrated conductor and capacitor as recited in claim 17 wherein said first dielectric material is a dielectric material having selected impedance properties for high speed operation and wherein said second dielectric material includes a selected one of the group of dielectric materials including NPO, X7R, X5R, C0G, and, YTV.

* * * * *